United States Patent
Fan

(10) Patent No.: US 6,432,207 B1
(45) Date of Patent: Aug. 13, 2002

(54) METHOD AND STRUCTURE FOR BAKING A WAFER

(75) Inventor: Hung-Yi Fan, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 09/801,341

(22) Filed: Mar. 7, 2001

(51) Int. Cl.$^7$ .......................... C23C 16/00; H01L 21/31
(52) U.S. Cl. .................. 118/724; 118/715; 118/725; 118/726; 118/728; 438/780; 219/444.1; 219/467.1; 392/418
(58) Field of Search ................. 118/715, 724, 118/725, 726, 728; 438/780; 219/444.1, 467.1; 392/418

(56) References Cited

U.S. PATENT DOCUMENTS

| | | | | |
|---|---|---|---|---|
| 4,556,785 A | * | 12/1985 | Blechscmid et al. | 219/460 |
| 5,756,964 A | * | 5/1998 | Hsu et al. | 219/392 |
| 5,865,893 A | * | 2/1999 | Matsunaga et al. | 118/319 |
| 6,002,108 A | * | 12/1999 | Yoshioka | 219/388 |
| 6,051,815 A | * | 4/2000 | Satou | 219/444.1 |
| 6,091,056 A | * | 7/2000 | Kannan et al. | 219/390 |
| 6,100,505 A | * | 8/2000 | Pike | 219/444.1 |
| 6,261,744 B1 | * | 7/2001 | Yoshioka | 430/325 |
| 6,293,789 B1 | * | 9/2001 | Rolfson et al. | 432/253 |

* cited by examiner

Primary Examiner—Alexander Ghyka
(74) Attorney, Agent, or Firm—J.C. Patents

(57) ABSTRACT

A method and structure for baking a wafer. A wafer is covered with a material layer and is located on a hot plate to perform a baking process. A plurality of spacers are located in between the wafer and the hot plate. The positions of the spacers are at the inner surface of the wafer and are away from the edge of the wafer. This arrangement prevents the spacer from directly contacting the edge of the wafer. A plurality of pinholes are formed on the hot plate. The spacers are located in these pinholes according to the various sizes of wafers. The number of spacers used depends on how many spacers can secure the wafer on the hot plate. The spacers have high thermal heat resistance and low conductivity. The spacers can be made of a non-metal material, for example a ceramic material or an industrial material. The spacers of the present invention have very small contact areas to allow an even distribution of temperature on the surface of the wafer.

10 Claims, 3 Drawing Sheets

METHOD AND STRUCTURE FOR BAKING A WAFER

BACKGROUND OF THE INVENTION

1. Field of Invention

The present invention relates generally to a method of fabricating a semiconductor. More particularly, the present invention relates to a method and structure of fabricating a wafer by baking.

2. Description of the Related Art

A polyimide has good insulating and high adhesive abilities. A polyimide is often used for the process of fabricating semiconductors. A polyimide is used as a protective layer, a buffer layer or a dielectric layer. In semiconductor fabrication, when forming a polyimide layer, a solvent is usually added into the precursor of the polyimide to form a solution. The solution is then applied on a substrate. When polyimide material is exposed to light, it will cause cross linking and patterning. Aside from the above-mentioned functions, forming a polyimide layer on the substrate also has a function of forming a patterned photoresist layer. Thus, the steps of the process can be reduced, and semiconductor fabrication can be applied more extensively, for example in forming a fuse wire pattern.

The polyimide layer is in a liquid state when the polyimide is applied on the surface of the substrate. The wafer will be subjected to a soft baking process to evaporate all the solvent in polyimide. The wafer will be then subjected to exposure and development processes sequentially.

The wafer baking method uses a hot plate to supply heat to the wafer in order to evaporate all the solvent in polyimide in the wafer. In FIG. 1A, a hot plate 100 is provided, and a plurality of pin holes 102 are formed on the hot plate 100. The positions of the pin holes are located to form a plurality of concentric circles, and these circles are formed with different sizes to correspond to various sizes of the wafers. Spacers 104 that can be made of a metal or a ceramic material are located in the positions of the pin holes 102 that correspond to the size of the wafer. The wafer coated with a polyimide layer 108 is located on the spacers 104. The wafer 106 is then subjected to a baking process in order to slightly solidify the polyimide layer 108.

FIG. 1B illustrates the contact position of the spacers 104 and the wafer 106. The wafer 106 is covered with the polyimide layer 108, and the edge of the back surface of the wafer 106 is in contact with a portion of the spacer's surface. That portion of the surface of the spacer 104 is exposed on the outside edge of the wafer 106. The baking method of the wafer mentioned above has the following disadvantages. If the material of the spacer is metal, the adhesive ability of the polyimide is very high, and the conductive coefficient of the spacers is high. The spacers will conduct heat easily and have a high temperature during the baking process. The wafer will heat up easily and cause the polyimide layer to melt and flow from the wafer surface to the edge. After some days of the operation, the accumulation will form polyimide residue on the spacers and the wafer edge. This polyimide residue adhered on the wafer edge can cause problems to the equipment and the wafer. For example, the polyimide residue on the wafer edge can cause a wafer notch search to an error and cause the barcode position to be shifted, a vacuum error problem on the stepper wafer chuck, or an equipment alignment error. If the spacer is made of ceramic material, the ceramic spacer also has the problems of the metal spacer mentioned above, and the ceramic spacer is very brittle as well. Once the spacer breaks, it will be adhered on the backside of the wafer.

After some days and continuous operation, the polyimide residue will pile up in the spacers. So all the spacers will need to be changed, approximately once a week, and 6 spacers are changed each time. Therefore the utilization rate of the equipment is decreased, and the cost of the equipment maintenance is high.

SUMMARY OF INVENTION

It is an object of the present invention to provide a method and structure of baking a wafer to avoid the formation of the polyimide residue on the wafer edge and improve the yield of the wafer. The present invention aims to avoid an uneven heat diffusion during a baking process of forming a polyimide layer. The polyimide layer then can be formed evenly on the wafer and the utilization rate can be improved. Therefore the cost of the process can be reduced.

The present invention provides a method and structure for baking a wafer in which the wafer that is covered with a material layer is placed on a hot plate to perform the baking process. The positions of the spacers that support the wafers are moved from the edge of the wafer to the inner side of the wafer. The spacers also have small contact areas to prevent the edge of the wafer from coming into contact with the spacers. A plurality of pin holes are formed on the hot plate, and the spacers are located in the pin holes. The number of spacers required depends on how many spacers are needed to stabilize the wafer on the hot plate. The spacers are made of a non-metal material that has high thermal resistance and low conductivity, so the spacers are able to come into contact with the backside of the wafer.

It is another object of the present invention to prevent the surfaces of the spacers from coming into contact with the edge of the wafer. The positions of the spacers that support the wafer are moved from the edge to the inner side of the wafer to avoid forming residue on the spacers that will adhere on the edge of the wafer if they come into contact with each other. The spacers are made of a non-metal material that has high thermal resistance and low conductivity, so the temperature of the contact region of the spacers and the wafer will not become too high. A problem of the conventional method is that a portion of the wafer has a high temperature and will cause the temperature to distribute unevenly on the wafer. The number of spacers used in the present invention is less than the conventional method. The spacers also will not be adhered to some residue. Therefore the spacers will be maintained in good condition and the utilization rate of the spacers will also increase. The cost of changing the spacers will then be reduced extremely.

The spacers of the present invention can be made into a conical structure. The tip of the conical spacer is in contact with the backside of the wafer. The contact area is thus reduced to avoid the uneven distribution of heat on the wafer during the baking process.

BRIEF DESCRIPTION OF THE DRAWINGS

It is to be understood that both the forgoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description serve to explain the principle of the invention. In the drawings.

DESCRIPTION OF THE PREFERRED EMBODIMENT

Figure 1A:
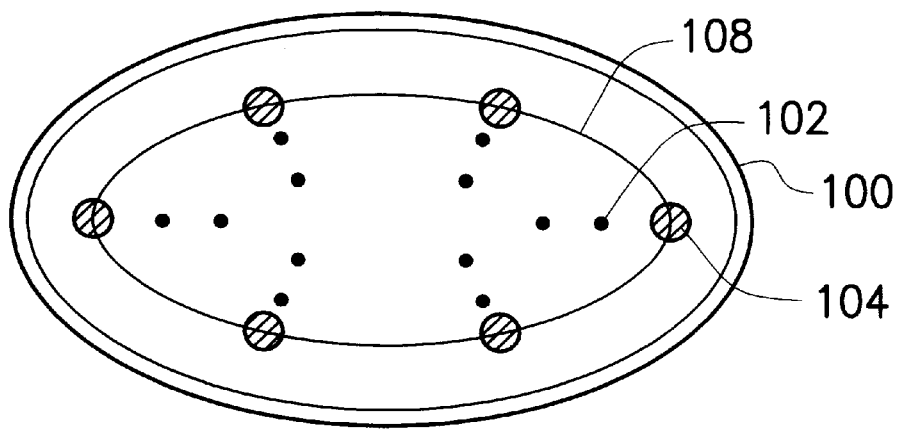
FIG. 1A is a schematic top view of a wafer baking method according to a conventional method.
Figure 1B:
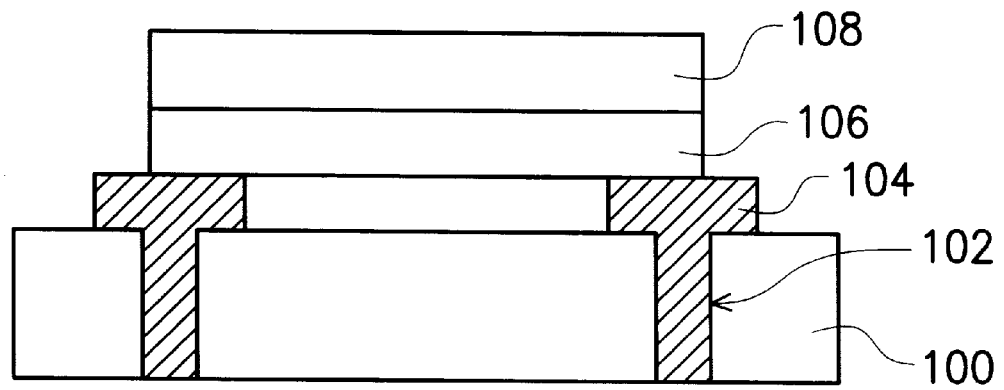
FIG. 1B is a schematic cross sectional view of a wafer baking method according to a conventional method.
Figure 2A:
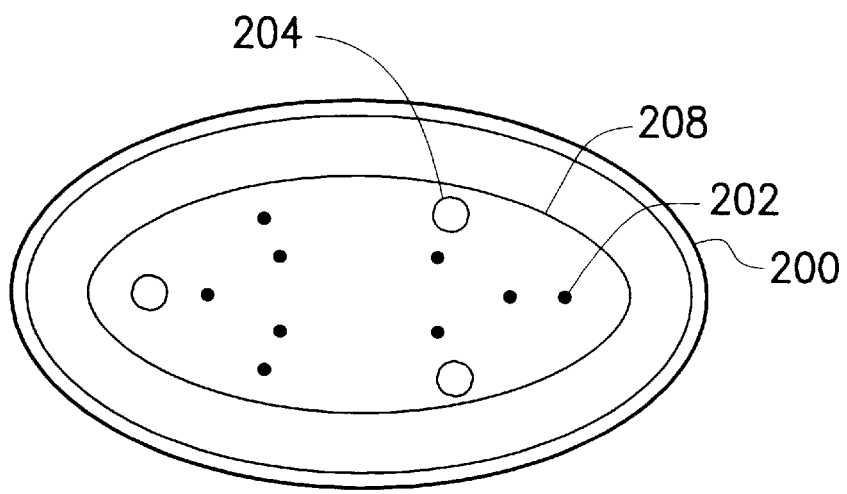
FIG. 2A is a schematic top view of a wafer baking method of a preferred embodiment of the present invention.

Referring to FIG. 2A, a material layer 208 is formed on a wafer 206 during a baking process. The wafer 206 is located on a hot plate 200 to perform the baking process. A plurality of spacers 204 are installed in between the space of the wafer 206 and the hot plate 200. The positions of the spacers 204 are away from the edge of the wafer 206 to prevent the surface of the hot plate 200 from directly contacting the wafer 206.

Figure 2B:
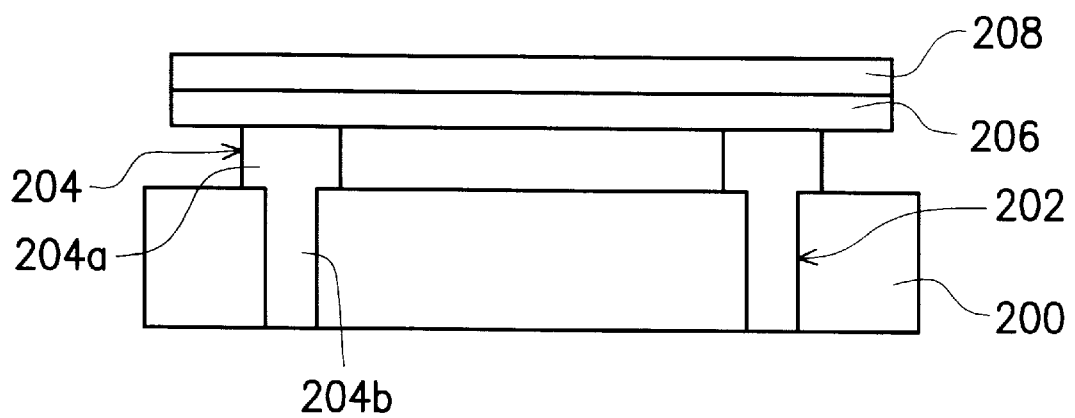
FIG. 2B is a schematic cross sectional view of a wafer baking method of a preferred embodiment of the present invention.

FIG. 2B illustrates the relationship of contact positions of the spacers 204 and the wafer 206. When the diameter of the wafer is 8 in., the positions of the spacers 204 are 6 in away from the center point of the hot plate 200. The spacers 204 are located in pin holes 202 which form a concentric circle with a diameter of 6 in. The number of spacers 204 that are required depends on how many spacers are needed to secure the wafer 206 on the hot plate 200. The position of the pin holes 202 are located from the center point of the hot plate 200 to form a plurality of concentric circles, and these circles are formed with different sizes to correspond to various sizes of the wafers. The spacers 204 are made of a non-metal material that has high thermal resistance and low conductivity. The surfaces of the spacers come into contact with the inner part of the backside of the wafer 206, and the spacers can avoid coming into contact with the edge of the wafer. The arrangement of the location of the spacers prevents the material layer 208 from flowing from the edge of the wafer 206 to the spacers 204. A residue problem is avoided, and the accumulated residue that adheres to the edge of the wafer 206 when the spacers 204 come into contact with it is also avoided.

Figure 3A:
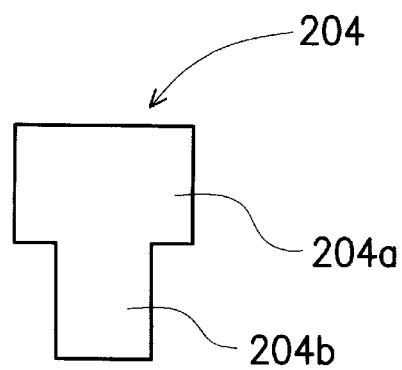
FIG. 3A is a schematic cross sectional view of a first type of a spacer structure of a preferred embodiment of the present invention.

Referring to FIG. 3A, a cross sectional view of a spacer 204 structure is shown. The structure of the spacer comprises a cap layer 204a and a pin 204b, wherein the cap layer 204a is located above the surface of the hot plate 200. The thickness of the cap layer is approximate 0.5 mm, and its contact area to the backside of the wafer is approximate 0.025 cm². The pins 204b of the spacers 204 are located in the pin holes 202 that are shown in FIG. 2B. The spacers are then secured in the hot plate 200 by positioning the pins 204b in the pin holes 202. The top parts of the cap layers 204a of the spacers 204 are made of a non-metal material that has high thermal resistance and low conductivity, for example a ceramic material or an industrial plastic material.

Figure 3B:
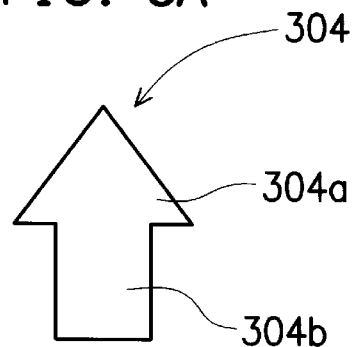
FIG. 3B is a schematic cross sectional view of a second type of a spacer structure of a preferred embodiment of the present invention.

Therefore when the cap layers come into contact with the backside of the wafer, heat will not be transmitted easily, and to the uneven distribution of temperature on the wafer is avoided. The contact area of the spacers and the wafer is very small, which also reduce the heat transmission from the spacers to the wafer. The material layer 208 can be formed evenly on the wafer. FIG. 3B illustrates a conical spacer 304 structure of a preferred embodiment of the present invention. The top layer of the conical spacer 304 is made of a non-metal material that has high thermal resistance and low conductivity. The conical spacer 304 comprises a tip 304a and a pin 304b. The tip 304a of the spacer 304 comes into contact with the backside of the wafer 206. The contact area is extremely small to avoid the heat transmission from the spacer to the wafer 206. The temperature can distribute evenly on the wafer 206 and the material layer 208 can then be formed evenly.

Figure 3C:
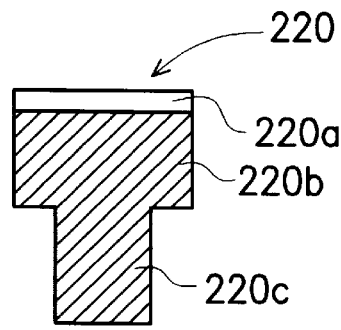
FIG. 3C is a schematic cross sectional view of a third type of a spacer structure of a preferred embodiment of the present invention.

FIG. 3C is a schematic cross-sectional view of a third type of spacer structure of a preferred embodiment of the present invention. The structure of the spacer comprises a high-thermal resistant layer 220a, a metal layer 220b and a pin 220c. The high-thermal resist layer 220a is made of a non-metal high thermal resistant and low conductive material, for example a ceramic material. The thickness of the high thermal resistant layer 220a is approximately 0.1 mm, and the thickness of the metal layer is approximately 0.4 mm. The contact area of the spacer to the backside of the wafer is approximately 0.025 cm². The metal part of the spacer is made of a metal material that is easily fabricated. A cap layer of the spacer comprises a high thermal resistant layer 220a and the metal layer 220b. The cap layer is located above the surface of the hot plate 200, and the pin 220c is located in the pinhole 202 to secure the spacer on the hot plate which is shown in FIG. 2B. The high-thermal resistant layer of the spacer 220 that is a ceramic layer comes into contact with the backside of the wafer 206, and the contact area is very small. The portion of the wafer that comes into contact with the spacer will not have a high temperature due to the low heat transmission from the surface of the spacer to the surface of the wafer. Thus the temperature of the wafer distributes evenly, and a material layer 208 can be formed evenly on the wafer.

Figure 3D:
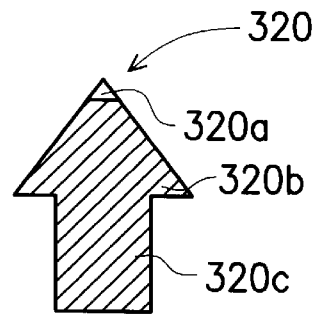
FIG. 3D is a schematic cross-sectional view of a fourth type of a spacer structure of a preferred embodiment of the present invention.

FIG. 3D is a schematic cross-sectional view of a structure of another conical spacer of a preferred embodiment of the present invention. This conical spacer 320 comprises a high-thermal resistant layer 320a, a metal layer 320b and pin 320c. The high thermal resistant layer 320a is made of a high thermal resistant and low conductive non-metal material, for example a ceramic material. The tip of the conical spacer 320 comes into contact with the backside of the wafer 206, and the contact area is extremely small. The heat transmission from the spacer to the wafer is minimized, and the uneven distribution of temperature on the wafer can be avoided. The material layer 208 can be formed evenly on the wafer.

From the preferred embodiments of the present invention mentioned above, the positions of the spacers are located on the inner side of the wafer. The surfaces of the spacers contact with the surface of the wafer instead of the edge of the wafer. This arrangement can prevent residue from adhering to the edge of the wafer.

The spacers of the present invention are made of a high thermal resistant and low conductive material, for example a ceramic material. Due to the small contact area, a material layer on the wafer can be heated up evenly during a baking process. An uneven material layer on the wafer and partial high temperature on the wafer can be avoided. The number of spacers that are used in the present invention is less than the conventional method, and there is no residue that adheres on the spacers or the edge of the wafer. The utilization rate of the spacers increases, and it is unnecessary to change the spacers regularly. The cost of the spacers is reduced. The spacers of the present invention can be made into a conical shape to reduce its contact area to a minimum in order to reduce the heat transmission. The uneven distribution of heat on the wafer can be avoided.

It will be apparent to those skilled in the art that various modifications and variations can be made to the structure of the present invention with out departing from the scope or spirit of the invention. In view of the forgoing, it is intended that the present invention cover modifications and variations of his invention provided they fall within the scope of the following claims and their equivalents.

What is claimed is:

1. A structure for baking a wafer comprising:
   a hot plate that has a plurality of pinholes in it is suitable for baking a wafer; and
   a plurality of spacers that are located in the pinholes and at the inner side of the wafer, wherein the spacers are used to support the wafer on the hot plate, and the spacers are positioned away from the edge of the wafer.

2. The structure for baking a wafer of claim 1, a wherein the spacers are made of a high thermal resistant and low conductive material.

3. The structure for baking a wafer of claim 2, wherein the spacers can be made of a ceramic material or an industrial plastic material.

4. The structure for baking a wafer of claim 1, wherein the spacer comprises a high thermal resistant layer and a metal layer, wherein the high-thermal resistant layer is formed on the metal layer.

5. The structure for baking a wafer of claim 4, wherein the high thermal layers are made of ceramic.

6. The structure for baking a wafer of claim 4, wherein the high thermal layers come into contact with the surface of the wafer.

7. A structure for baking a wafer comprising:
   a hot plate that has a plurality of pinholes in it is suitable for baking a wafer; and
   a plurality of conical spacers that are located in the pinholes and at the inner side of the wafer, wherein the conical spacers are used to support the wafer on the hot plate, and the conical spacers are positioned away from the edge of the wafer.

8. structure for baking a wafer of claim 7, wherein the conical spacer is made of a high thermal resistant and low conductive material.

9. The structure for baking a wafer of claim 7, wherein the conical spacers are made of a high thermal resistant metal material.

10. The structure for baking a wafer of claim 7, wherein tips of the conical spacers come into contact with a back surface of the wafer.

* * * * *